(12) United States Patent
Jeng et al.

(10) Patent No.: US 6,292,522 B1
(45) Date of Patent: Sep. 18, 2001

(54) FREQUENCY DECODER DATABANK FOR PHASE-LOCKED LOOP

(75) Inventors: Edward Jewjing Jeng, Fremont; Benedict Man-Fui Lok, Santa Clara, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 08/969,401

(22) Filed: Nov. 13, 1997

(51) Int. Cl.[7] ................................................... H03D 3/24
(52) U.S. Cl. ................................................ 375/376; 375/226
(58) Field of Search ........................................ 375/224, 226, 375/294, 327, 371, 375, 376; 329/307, 325, 360; 332/127; 331/1, 25; 324/521, 522, 527, 76.53

(56) References Cited

U.S. PATENT DOCUMENTS

| | | | |
|---|---|---|---|
| 4,954,773 | * 9/1990 | Brust | 324/751 |
| 5,072,195 | * 12/1991 | Graham et al. | 331/2 |
| 5,075,640 | * 12/1991 | Miyazawa | 331/10 |
| 5,125,107 | * 6/1992 | Herold et al. | 455/226 |
| 5,162,744 | * 11/1992 | Koozer | 324/618 |
| 5,191,295 | * 3/1993 | Necoechea | 328/155 |
| 5,402,446 | * 3/1995 | Minami | 375/344 |
| 5,557,648 | * 9/1996 | Ishihara | 375/376 |
| 5,745,011 | * 4/1998 | Scott | 331/44 |
| 5,748,044 | * 5/1998 | Xue | 331/2 |
| 5,751,195 | * 5/1998 | Black | 331/17 |
| 5,790,613 | * 8/1998 | Tateishi | 375/376 |
| 5,856,763 | * 1/1999 | Reeser et al. | 331/49 |
| 5,883,533 | * 3/1999 | Matsuda et al. | 327/156 |
| 5,923,489 | * 7/1999 | Saito | 360/70 |
| 5,983,077 | * 11/1999 | Dent | 455/44 |
| 6,005,904 | * 12/1999 | Knapp et al. | 375/376 |

* cited by examiner

Primary Examiner—Chi Pham
Assistant Examiner—Emmanuel Bayard

(57) ABSTRACT

A phase-locked loop cell includes a voltage-controlled oscillator adapted to produce an oscillating signal. A test input to the phase-locked loop is adapted to cause the voltage-controlled oscillator to generate a test oscillating signal. A frequency decoder is coupled to the output of the voltage controlled oscillator and is adapted to provide a voltage related to the frequency of the test oscillating signal.

18 Claims, 5 Drawing Sheets

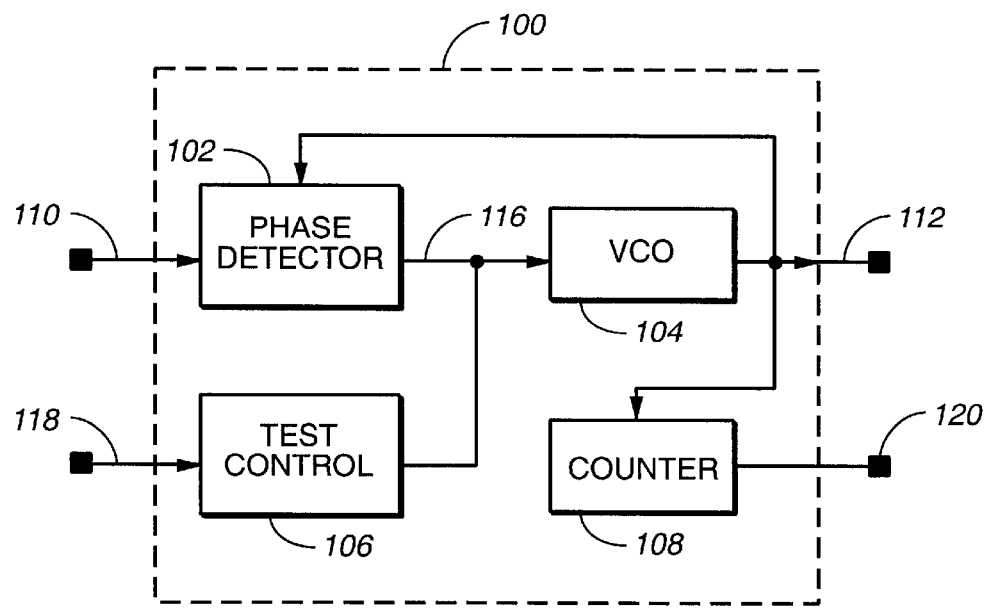
FIG._1
*(PRIOR ART)*
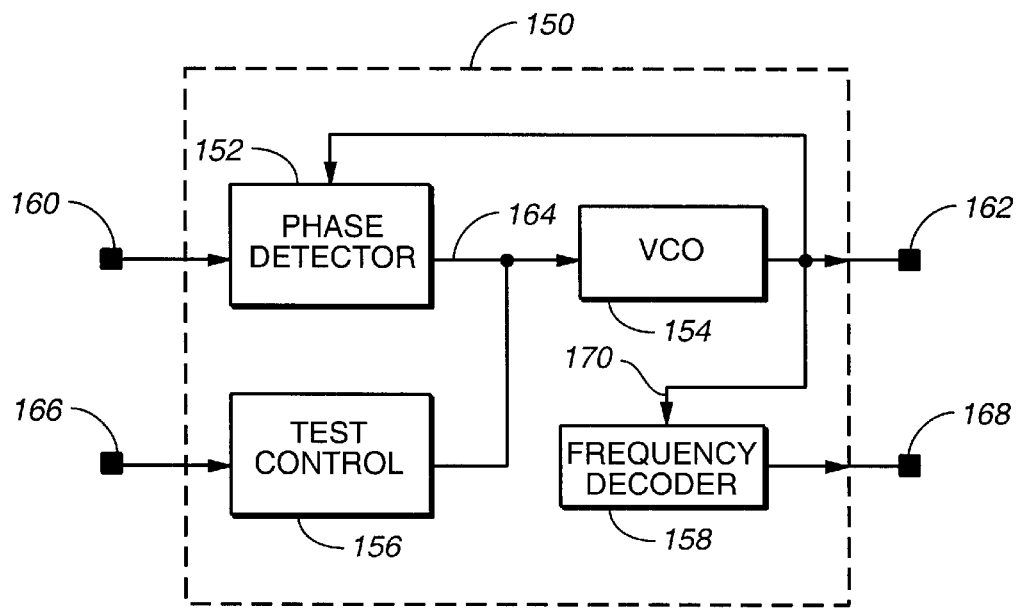
FIG._3

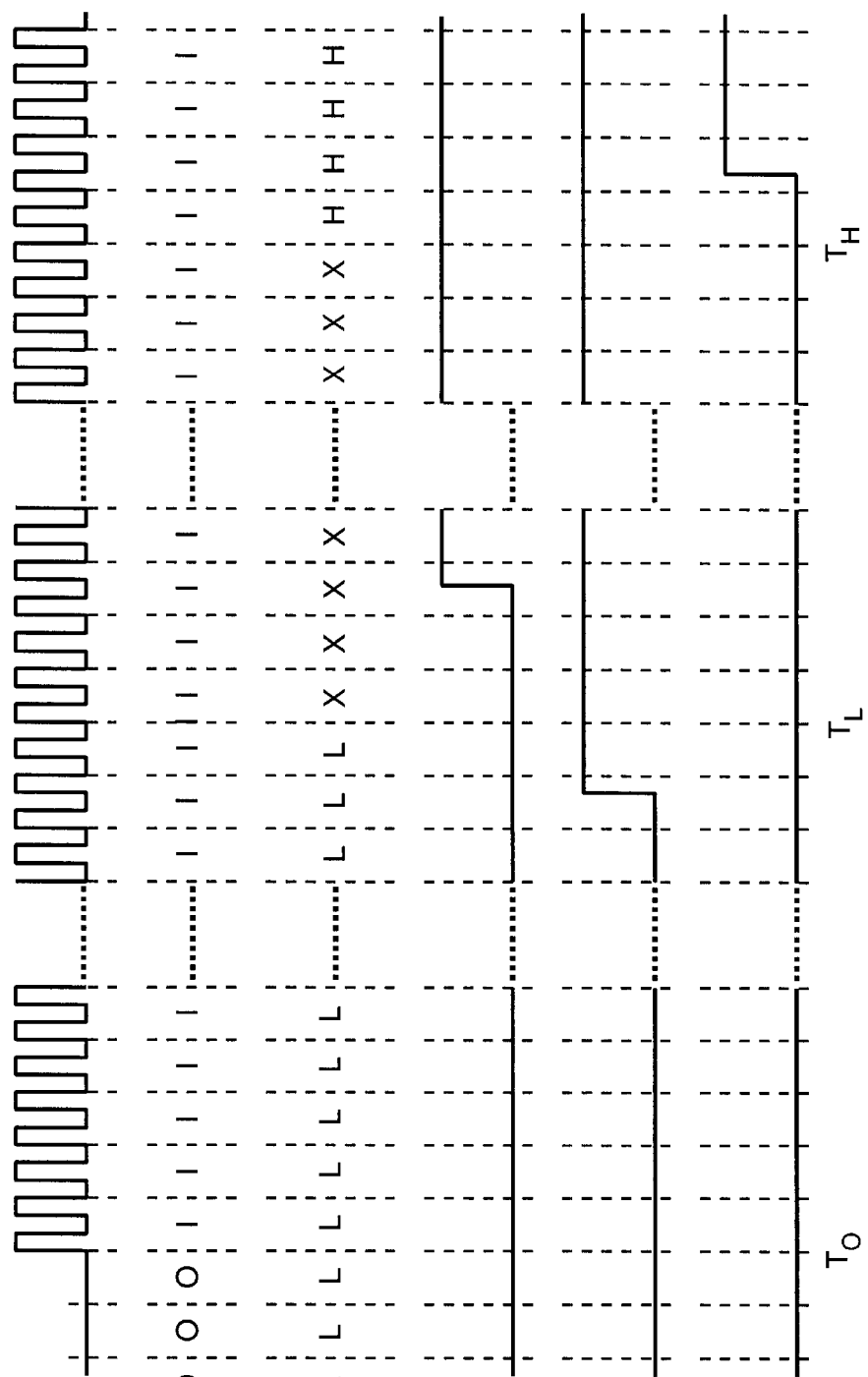
FIG._2A (PRIOR ART)
FIG._2B (PRIOR ART)
FIG._2C (PRIOR ART)
FIG._2D (PRIOR ART)
FIG._2E (PRIOR ART)
FIG._2F (PRIOR ART)

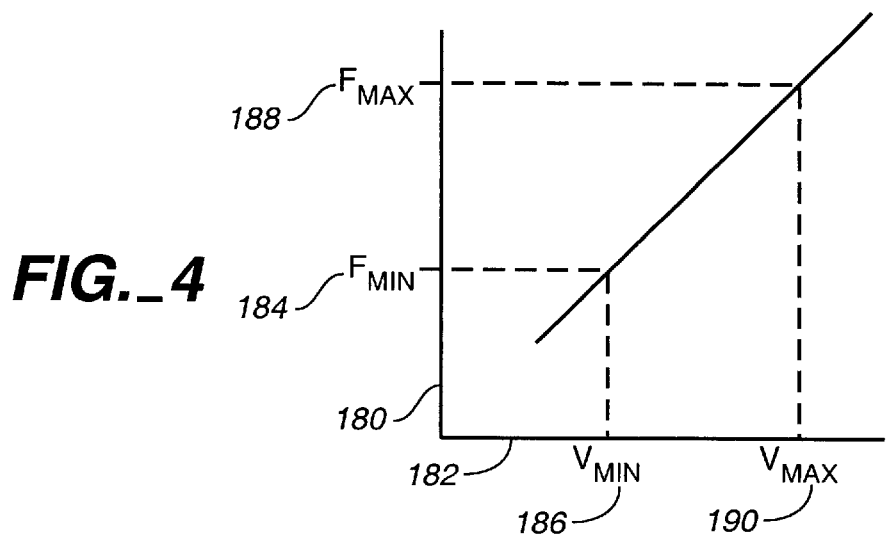
FIG._4
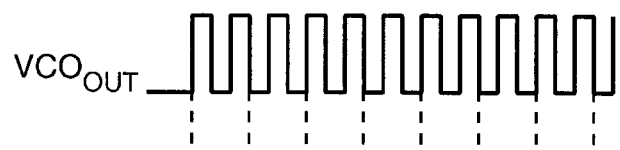
FIG._5A
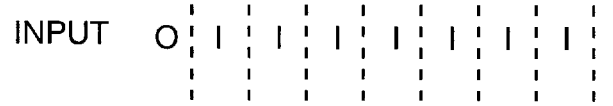
FIG._5B
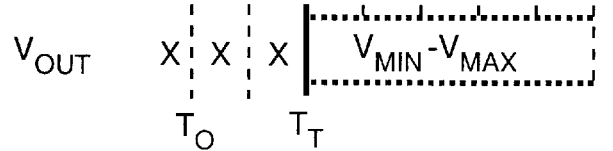
FIG._5C

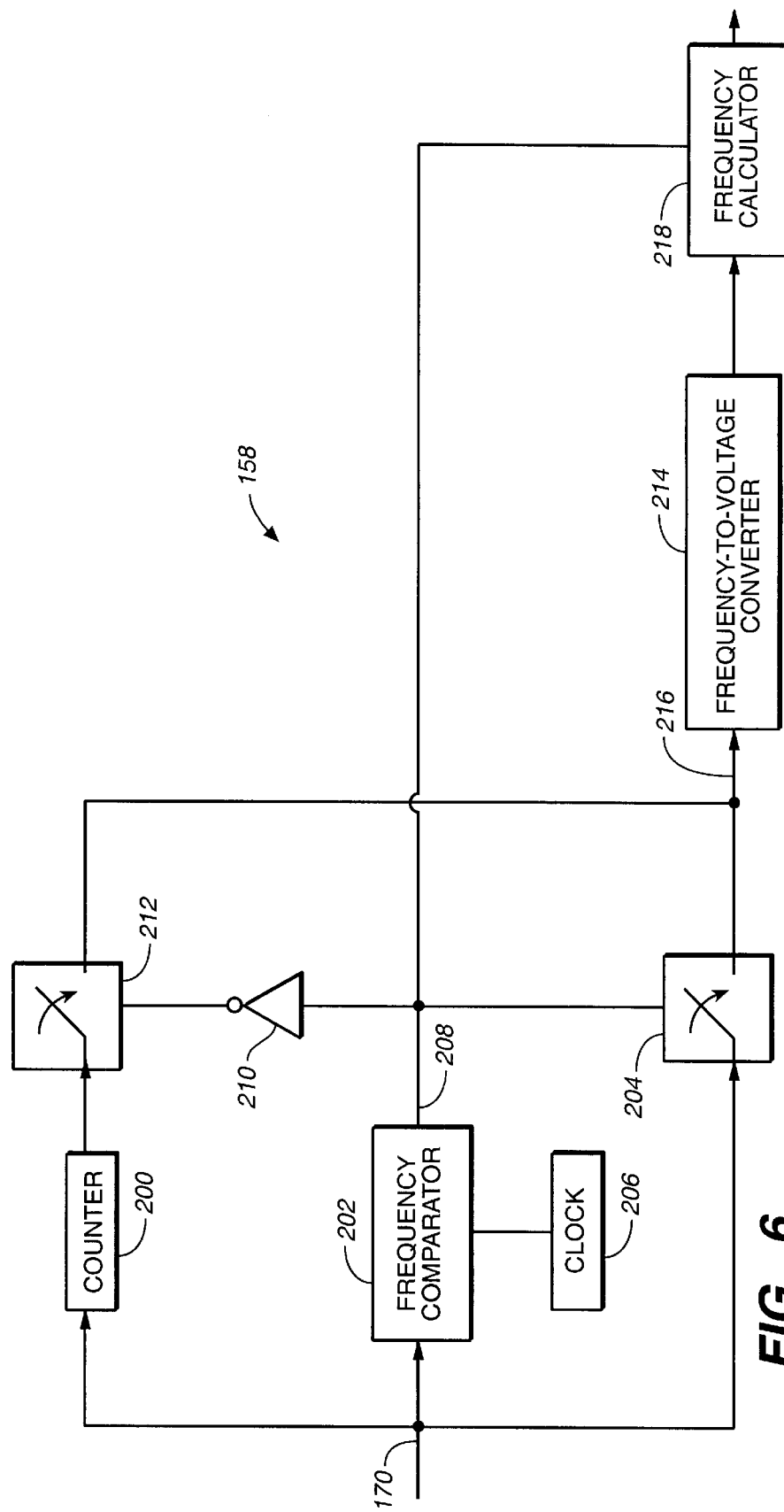
FIG._6

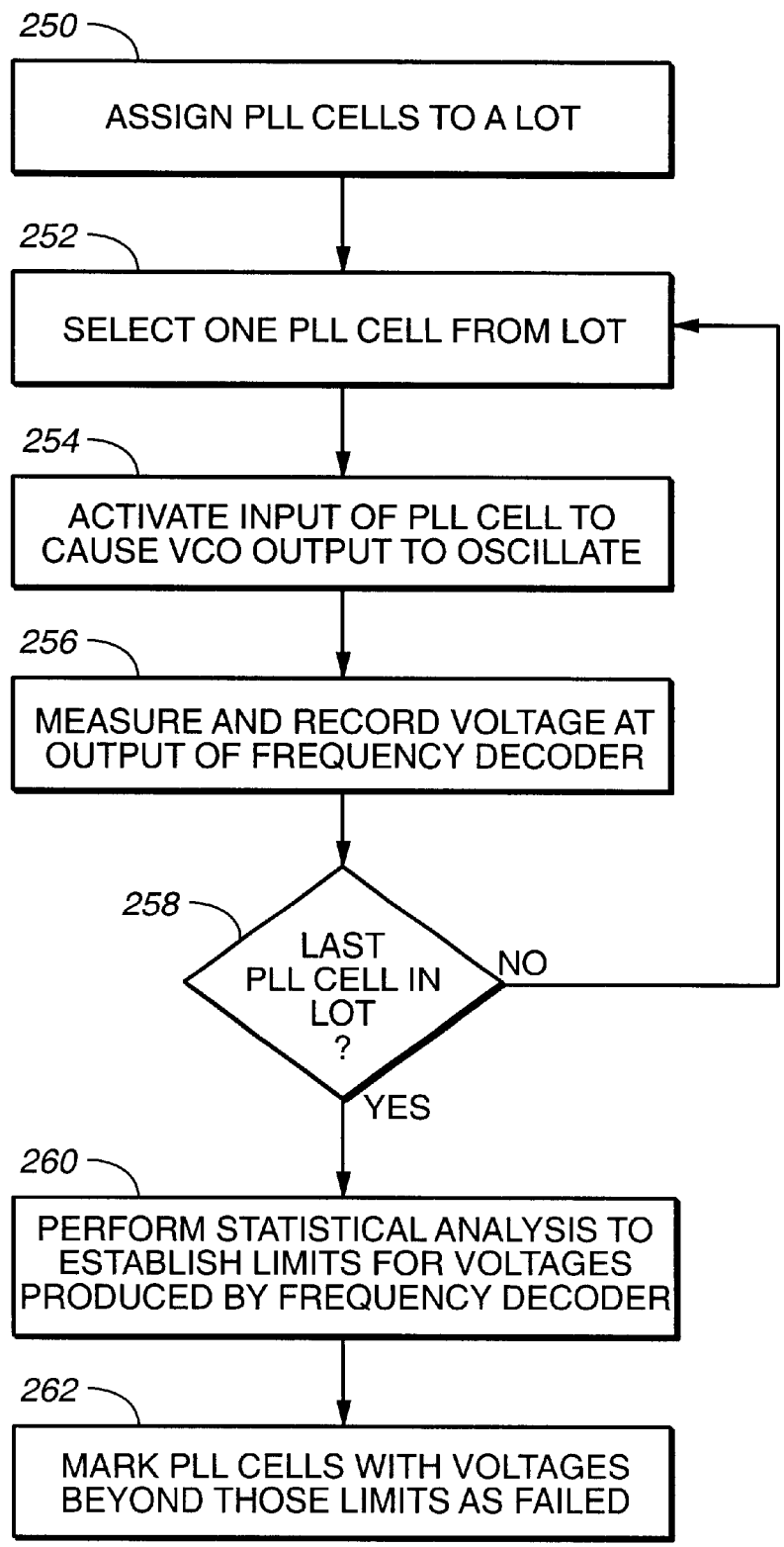
FIG._7

FREQUENCY DECODER DATABANK FOR PHASE-LOCKED LOOP

BACKGROUND OF THE INVENTION

The present invention relates to phase-locked loop testing. In particular, the present invention relates to testing the voltage-controlled oscillator of a phase-locked loop cell.

Phase-locked loop (PLL) cells are commonly used in data receivers to generate square-wave clock signals that have frequencies equal to the frequency of the incoming data. To accommodate variations in the frequency of the transmitted data, a phase detector in the PLL cell continuously monitor the data and the clock signal. The phase detector creates a voltage based on the phase difference between the two signals and this voltage is used to drive a voltage-controlled oscillator, which produces the square-wave clock signal in response to the voltage.

Before shipping a PLL cell, the voltage-controlled oscillator is tested to ensure that it is operating properly. To accomplish this frequency testing, the art attaches a counter to the output of the voltage-controlled oscillator and stimulates the oscillator so that it produces an oscillating signal. Each positive-going transition in the oscillating signal causes the counter to increment by one. When the counter reaches a specific count, its output transitions from LOW to HIGH. The amount of time that passed between when the voltage-controlled oscillator was first activated and when the counter output became HIGH is indicative of the frequency of the clock signal.

In the art, such counters are used because they allow frequency testing to be accomplished using a series of test vectors. Each test vector occurs at a specific time during testing and includes the input values provided to the PLL cell and the binary output values expected to be produced by the cell at that particular instant in testing.

Although test vectors provide an automated means for testing the frequency of the voltage-controlled oscillator, they typically only provide "GO", "NO-GO" testing where the PLL cell either passes or fails the test. The test vectors do not convey the actual frequency of the voltage-controlled oscillator's signal. They only state that the frequency is too high, too low, or within an accepted range of frequencies.

The initial acceptable range of frequencies is taken from the data books for the PLL cell. However, these initial ranges often do not fully account for process and temperature variations. To accommodate these variations, the art measures the number of cells that fail the frequency test, and if the number is too high, adjusts the acceptable range of frequencies for the voltage-controlled oscillator. However, because test vectors do not provide information about the actual frequencies of the oscillators, it is impossible to determine a distribution of actual frequencies. As such, a change made to the acceptable frequency range is often nothing more than a guess and several iterations are needed before the proper range is achieved.

This is extremely time consuming and costly because each change in the frequency range requires changes to the test vectors and these test vector changes typically must be made by a design engineer who is located away from the test floor.

SUMMARY OF THE INVENTION

A phase-locked loop cell includes a voltage-controlled oscillator adapted to produce an oscillating signal. A test input to the phase-locked loop is adapted to cause the voltage-controlled oscillator to generate a test oscillating signal. A frequency decoder is coupled to the output of the voltage controlled oscillator and is adapted to provide a voltage related to the frequency of the test oscillating signal.

BRIEF DESCRIPTION OF THE DRAWINGS

FIG. 1 is a block diagram of a prior art PLL cell.

FIG. 2A is a VCO test output of the prior art.

FIG. 2B is a series of test vector values of the prior art for input pin 118 of FIG. 1.

FIG. 2C is a series of test vector values of the prior art for counter output 120 of FIG. 1.

FIG. 2D is an actual counter output for a PLL cell that passes the VCO frequency test.

FIG. 2E is an actual counter output for a PLL cell that fails the VCO frequency test.

FIG. 2F is an actual counter output for a PLL cell that fails the VCO frequency test.

FIG. 3 is a block diagram of a PLL cell of the present invention.

FIG. 4 is a graph of the voltage produced by frequency decoder 158 as a function of frequency.

FIG. 5A is a timing diagram of the VCO 154's output.

FIG. 5B is a series of test vector values for test input 166 of FIG. 3.

FIG. 5C is a timing diagram of expected outputs from frequency decoder 158 of FIG. 3 during testing.

FIG. 6 is a block diagram of frequency decoder 158 of FIG. 3.

FIG. 7 is a flow diagram of a method of testing PLL cells under the present invention.

DETAILED DESCRIPTION OF THE PREFERRED EMBODIMENTS

FIG. 1 is a block diagram of a phase-locked loop (PLL) cell 100 of the prior art. PLL cell 100 includes phase detector 102, voltage-controlled oscillator (VCO) 104, test control 106, and counter 108. PLL cell 100 receives an input signal on input line 110 and produces an output signal on output line 112 that has a particular phase relationship to the input signal. Phase detector 102 is connected to input line 110 and to output line 112 and produces an output voltage on a node 116 that is related to the phase difference between the signal on input line 110 and the signal on output line 112.

VCO 104 has its input connected to node 116 and thus receives the output from phase detector 102. Based on the voltage at node 116, VCO 104 produces an oscillating signal on output line 112. In general, as the voltage at node 116 increases, the frequency of the oscillating signal increases. Thus, as the frequency of the input signal on input line 110 varies, phase detector 102 and VCO 104 cooperate to maintain the output signal on output line 112 in a particular phase relationship with the input signal. The output signal and the input signal will have the same frequency but may be phase shifted as desired.

PLL cell 100 includes test control 106, which is used to test VCO 104. Test control 106 has an input connected to test input 118 and an output connected to node 116. When test input 118 has a logical HIGH value, test control 106 generates a fixed voltage on node 116 to cause VCO 104 to generate an oscillating signal. The oscillating signal produced by VCO 104 is input to counter 108 which is connected to output 112 and which provides a counter output 120. Counter 108 is driven by the oscillations of the oscillating signal such that each positive-going transition in the oscillating signal causes counter 108 to increment by one. After counter 108 reaches a specified count, counter output 120 transitions from logical LOW to HIGH.

In the prior art, to test VCO 104, test input 118 was set to HIGH and counter output 120 was checked to make sure that it did not transition from LOW to HIGH too early or too late. The test process of the prior art is discussed further in connection with FIGS. 2A through 2F.

FIGS. 2A through 2F are timing diagrams that share a common horizontal time axis. FIG. 2A is a depiction of the oscillating voltage signal produced by VCO 104 during testing. FIG. 2B shows a series of test vector values for test input 118. Before testing begins, test input 118 has a value of zero. When VCO testing begins, test input 118 transitions 0 to 1 causing test control 106 to activate VCO 104 thereby producing the oscillating signal shown in FIG. 2A. As long as test input 118 is 1, VCO 104 should produce an oscillating signal.

FIG. 2C shows a series of output vector values for the expected value of counter output 120 based upon the test vector values of test input 118. From time $T_O$, when test input 118 transitions from 0 to 1, until a time $T_L$, counter output 120 should be LOW (L). From time $T_L$ until time $T_H$ counter output 120 can be either LOW or HIGH as indicated by the X's appearing in FIG. 2C. Sometime before $T_H$, counter output 120 should transition from LOW to HIGH so that at time $T_H$ counter output 120 is HIGH (H).

$T_L$ and $T_H$ are functions of the maximum and minimum permissible frequencies, respectively, for VCO 104. Time $T_L$ is calculated by multiplying the reciprocal of the maximum frequency permitted for VCO 104 times the count that causes counter output 120 to transition from LOW to HIGH. Thus, if the maximum acceptable frequency is 40 MHz and counter output 120 transitions from LOW to HIGH after 1024 counts, $T_L$ is determined by the following equation:

$$T_L = T_O + \frac{1024}{40 \times 10^6 \text{ Hz}} \qquad \text{EQ. 1}$$

which means that $T_L$ occurs 25,600 nanoseconds after $T_O$.

$T_H$ is equal to the reciprocal of the lowest acceptable frequency for VCO 104 times the counter transition value. Thus, for a minimum acceptable frequency of 25 MHz, and a counter transition value of 1024 counts, $T_H$ is defined by the following equation:

$$T_H = T_O + \frac{1024}{25 \times 10^6 \text{ Hz}} \qquad \text{EQ. 2}$$

resulting in $T_H$ occurring 40,960 nanoseconds after $T_O$.

FIG. 2D shows an actual counter output for a PLL cell of the prior art that passes the VCO frequency test. The PLL cell passes because the counter output transitions from LOW to HIGH between time $T_L$ and time $T_H$. FIG. 2E shows a counter output for a PLL cell of the prior art that fails the VCO frequency test. Specifically, the PLL cell associated with FIG. 2E has an output frequency that is too high and that causes counter output 120 to transition from LOW to HIGH before $T_L$. FIG. 2F shows a PLL cell of the prior art that fails the VCO frequency test because the VCO operates at too low of a frequency causing counter output 120 to transition from LOW to HIGH after time $T_H$.

FIG. 3 shows a PLL cell 150 of the present invention which includes a phase detector 152, a voltage controlled oscillator 154, a test control 156, a frequency decoder 158, an input 160 and an output 162. Input 160 and output 162 are connected to phase detector 152 which produces a voltage at node 164 indicative of the difference between a desired phase shift between the signal on input 160 and the signal on output 162 and an actual phase shift between the two signals.

VCO 154 has an input connected to node 164 and creates an oscillating signal on output 162. The oscillating signal created by VCO 154 has a frequency that is a function of the voltage on node 164.

A test input 166 is connected to test control 156, and when toggled from LOW to HIGH, causes test control 156 to produce a voltage on node 164 that causes VCO 154 to generate a test oscillating signal. The oscillating signal produced by VCO 154 is input to frequency decoder 158's input 170. Frequency decoder 158 produces a voltage at decoder output 168 that is a function of the frequency of the test oscillating signal produced by VCO 154.

FIG. 4 is a graph of the voltage produced at decoder output 168 as a function of the frequency of the test oscillating signal produced by VCO 154. Vertical axis 180 of FIG. 4 denotes the frequency of the test oscillating signal with the frequency increasing in an upward direction. Horizontal axis 182 denotes the voltage of decoder output 168 with the voltage increasing from left to right. As shown in FIG. 4, the voltage of decoder output 168 preferably increases in a linear manner with increases in the frequency of the test oscillating signal.

In FIG. 4, frequency 184 represents a minimum acceptable frequency for the oscillating signal produced by VCO 154 during testing. Frequency 184 is associated with a minimum voltage 186 found at decoder output 168 during testing. Similarly, frequency 188 represents a maximum acceptable frequency for the test oscillating signal and voltage 190 represents its associated maximum output voltage for decoder output 168. Thus, for a PLL cell to be operating within its stated parameters, the frequency decoder output 168 should produce a voltage between minimum voltage 186 and maximum voltage 190 during testing.

FIGS. 5A, 5B and 5C are timing diagrams that share a common horizontal time axis. FIG. 5A depicts the oscillating signal produced by voltage controlled oscillator 150 of FIG. 3; FIG. 5B depicts test vector values for test input 166 of FIG. 3; and FIG. 5C depicts expected voltages for decoder output 168 of FIG. 3. Before testing begins, test input 166 has a value of zero and VCO 154 does not produce an oscillating signal. At time $T_O$, input 166 transitions from 0 to 1 causing VCO 154 to begin producing an oscillating signal. Between time To and time $T_T$, frequency decoder 158 is determining the frequency of the oscillating signal produced by VCO 154. After time $T_T$, frequency decoder 158 arrives at a voltage indicative of the frequency of the oscillating signal produced by VCO 154. This voltage should be between $V_{MIN}$ 186 and $V_{MAX}$ 190 of FIG. 4.

FIG. 6 is a block diagram of frequency decoder 158 of FIG. 3. Frequency decoder 158's input 170 is connected to a counter 200, a frequency comparator 202, and a switch 204. Frequency comparator 202 has a second input connected to a clock 206 that produces an oscillating signal with a fixed frequency of preferably 1 MHz. Frequency comparator 202 compares the frequency of the signal on input 170 to the signal produced by clock 206 and produces a binary output 208 based on that comparison. In particular, binary output 208 is HIGH when the signal on input 170 has a frequency lower than the frequency of clock 206 and is LOW when the signal on input 170 has a frequency greater than the frequency of clock 206.

Binary output 208 is connected directly to the control input of a switch 204 and to one terminal of an inverter 210. The second terminal of inverter 210 is connected to a control input of a switch 212. Switches 204 and 212 are identical. When they receive a LOW value at their control input they open, by interrupting current flow from their input to their output. When they receive a HIGH value at their control input they close, allowing current to flow from their input to their output. Because of inverter 210, switches 204 and 212 are never opened or closed together but instead are always in opposite states. Thus when switch 204 is closed, switch 212 is open.

Counter 200 increments by one with each positive going transition in the oscillating signal at input 170. After counter 200 registers a specific number of such transitions, its output, which is connected to the input of switch 212, transitions from LOW to HIGH. After counter 200 again registers the specific number of transitions, its output transitions from HIGH to LOW. In preferred embodiments, the output of counter 200 transitions from LOW to HIGH when counter 200 registers a count of 500.

In operation, frequency comparator 202 compares the frequency of input signal 170 against the frequency of clock signal 206. If the frequency of the signal on input 170 is less than the frequency of clock signal 206, switch 204 is closed and the signal on input 170 is passed to a frequency-to-voltage converter 214. If the signal on input 170 has a frequency greater than the frequency of clock 206, the output of frequency comparator 208 is LOW causing switch 204 to open and switch 212 to close. With switch 212 closed, frequency-to-voltage converter 214 receives the output of counter 200. Since counter 200 only transitions after a particular number of counts, known as a cycle count, counter 200 essentially divides the frequency of the signal on input 170 by two times the cycle count. Thus, when switch 212 is closed, frequency-to-voltage converter 214 receives an oscillating signal that has a frequency equal to the frequency of the signal on input 170 divided by two times the cycle count of counter 200.

Frequency-to-voltage converter 214 converts the frequency of the signal it receives at its input 216 into a voltage. Many such frequency-to-voltage converters exist in the art and may be found in text books dedicated to such conversions. Preferably, frequency-to-voltage converter 214 produces a voltage that is a linear function of the frequency of the signal at input 216.

The voltage produced by frequency-to-voltage converter 214 is provided to frequency calculator 218, which also receives output 208 of frequency comparator 202. Frequency calculator 218 compensates for any division of the test oscillating signal's frequency by counter 200 if the frequency of the signal on input 170 was greater than the frequency of the clock signal produced by clock 206. Thus, if comparator output 208 is LOW, frequency calculator 218 multiplies the voltage produced by frequency-to-voltage converter 214 by two times the cycle count of counter 200. For example, if counter 200 has a cycle count of 500, frequency calculator 218 multiplies the voltage produced by frequency-to-voltage converter 214 by 1000. If comparator output 208 is HIGH, frequency calculator 218 simply passes the voltage produced by frequency-to-voltage converter 214 to its output.

Counter 200 and frequency calculator 218 permit a less sophisticated frequency-to-voltage converter 214 to be used in frequency decoder 158 by allowing frequency-to-voltage converter 214 to operate at a lower frequency.

FIG. 7 is a flow diagram of a method of testing PLL cells under the present invention. In block 250, the PLL cells are assigned to a lot, typically consisting of those PLL cells constructed from wafers found in the same wafer boat. At step 252, one of the PLL cells is selected from the lot and in step 254, this PLL cell is tested by activating its test input to cause its VCO to produce a test oscillating output. In step 256, the voltage provided at the output of the frequency decoder is measured and recorded.

If the present PLL cell is the last cell in the lot at decision box 2S8, testing continues in box 260. If the present PLL cell is not the last PLL cell in the lot, testing returns to step 252.

At step 260 each of the PLL cells in the lot has been tested. At this point, statistical analysis is performed on the recorded voltages to establish a distribution of frequencies for the test oscillating signals, and acceptable limits for these voltages are produced based on this distribution. In step 262 these new limits are compared against the recorded voltages for each PLL cell in the lot and those PLL cells with voltages beyond the limits are marked as failed.

The method of FIG. 7 provides a distinct advantage over the prior art by eliminating the repetitive steps commonly needed to set the appropriate limits for the frequency of the test oscillating signal produced by the VCO. Instead, statistical analysis can be performed on the recorded voltages for the signals produced by each voltage controlled oscillator, and this statistical analysis directly indicates the proper ranges for the frequency of the test oscillating signal.

Although the present invention has been described with reference to preferred embodiments, workers skilled in the art will recognize that changes may be made in form and detail without departing from the spirit and scope of the invention.

What is claimed is:

1. A method for testing a phase-locked loop's voltage controlled oscillator, the method comprising:

activating the voltage controlled oscillator so that it generates a signal having a frequency;

converting the frequency to a measured voltage;

recording the measured voltage;

comparing the recorded voltage to an upper limit voltage and a lower limit voltage; and marking the phase-locked loop as failed if the measured voltage is greater than the upper limit voltage.

2. The method of claim 1 further comprising marking the phase-locked loop as failed if the measured voltage is less than the lower limit voltage.

3. The method of claim 2 further comprising testing each phase-locked loop in a group of phase-locked loops.

4. The method of claim 3 further comprising:

determining a statistical distribution of measured voltages for a number of phase-locked loops;

assigning a new upper limit voltage and a new lower limit voltage based upon the statistical distribution;

comparing each recorded voltage of each phase-locked loop in the group of phase-locked loops to the new upper limit and the new lower limit; and rejecting those phase-locked loops with recorded voltages greater than the new upper limit.

5. The method of claim 4 further comprising rejecting those phase locked loops with recorded voltages less than the new lower limit.

6. A phase-locked loop cell for creating a clock signal in a particular phase with an input signal, the phase-locked loop comprising;

a voltage controlled oscillator, adapted to produce an oscillating signal at its output;

a test input adapted to cause a fixed voltage to be generated when the voltage controlled oscillator is not generating an oscillating signal and while the input signal is at a fixed value, the fixed voltage causing the voltage controlled oscillator to begin generating a test oscillating signal at its output; and a frequency decoder, coupled to the output of the voltage controlled oscillator and adapted to provide a voltage that is proportional to the frequency of the test oscillating signal, the voltage provided at a frequency decoder output pad.

7. The phase-locked loop of claim 6 wherein the frequency decoder comprises:

a first switch having an input, an output and a control terminal, the input coupled to the voltage controlled oscillator output;

a counter, having an input and an output, the input coupled to the voltage controlled oscillator output;

a second switch having an input, an output and a control terminal, the input coupled to the output of the counter;

a frequency comparator, having an output coupled to the control terminal of the first switch, a first input coupled to the voltage controlled oscillator output, and a second input receptive of a clock signal;

an inverter, coupled between the control terminal of the second switch and the output of the frequency comparator;

a frequency-to-voltage converter having an output and an input, the input coupled to the output of the first switch and the output of the second switch; and a voltage calculator, having a first input coupled to the frequency-to-voltage converter output, a second input coupled to the output of the frequency comparator, and having a voltage output.

8. The phase-locked loop of claim 7 wherein the frequency decoder further comprises a clock having a clock output connected to the second input of the frequency comparator.

9. The phase-locked loop of claim 8 wherein the frequency comparator produces a first voltage at its output when the frequency of the test oscillating signal is less than the frequency of the clock signal and produces a second voltage at its output when the frequency of the test oscillating signal is greater than the frequency of the clock signal.

10. The phase-locked loop of claim 9 wherein the signal at the output of the frequency comparator causes the first switch to open and the second switch to close when the output of the frequency comparator is at the second voltage.

11. The phase-locked loop of claim 10 wherein the signal at the output of the counter has a frequency that is a fraction of the frequency of the test oscillating signal.

12. The phase-locked loop of claim 11 wherein the frequency-to-voltage converter produces a voltage that is a linear function of the frequency of the signal at the frequency-to-voltage converter's input.

13. The phase-locked loop of claim 11 wherein the voltage calculator multiplies the ration of the frequency of the test oscillating signal to the frequency of the signal at the output of the counter by the voltage at the output of the frequency-to-voltage counter.

14. An apparatus for producing an output signal in a particular phase with an input signal, the apparatus comprising:

phase sensing means, receiving the input signal and the output signal for producing a voltage at its output indicative of a phase difference between the input signal and the output signal;

a voltage controlled oscillator, coupled to the output of the phase sensing means and adapted to produce the output signal in response to the voltage produced by the phase sensing means;

test input means for generating a voltage when the voltage controlled oscillator is not producing an output signal and the input signal is at a fixed value and thereby causing the voltage controlled oscillator to begin producing a test output signal; and frequency conversion test means connected to the output of the voltage controlled oscillator and distinct from the phase sensing means for producing a voltage that is proportional to the frequency of the test output signal.

15. The apparatus of claim 14 wherein the frequency conversion test means comprises:

frequency comparing means, coupled to the oscillator for comparing the frequency of the test output signal to a threshold frequency;

division means, coupled to the voltage controlled oscillator for dividing the frequency of the test output signal to produce a divided signal;

switching means, coupled to the division means and the voltage controlled oscillator for selecting between the test output signal and the divided signal; and frequency to voltage conversion means coupled to the switching means for converting a frequency into a voltage.

16. The apparatus of claim 15 wherein the frequency-to-voltage conversion means comprises:

a frequency-to-voltage converter for creating a converter voltage as a linear function of the frequency of a signal; and calculator means connected to the frequency-to-voltage converter for adjusting the converter voltage when the switching means selects the divided signal.

17. The apparatus of claim 16 wherein the calculator means multiplies the converter voltage by a conversion value.

18. The apparatus of claim 17 wherein the conversion value is equal to the frequency of the test output signal divided by the frequency of the divided signal.

* * * * *